US010363537B2

(12) United States Patent
Detavernier et al.

(10) Patent No.: US 10,363,537 B2
(45) Date of Patent: Jul. 30, 2019

(54) DEPOSITION TOOL FOR COMBINATORIAL THIN FILM MATERIAL LIBRARIES

(71) Applicant: UNIVERSITEIT GENT, Ghent (BE)

(72) Inventors: Christophe Detavernier, Denderleeuw (BE); Davy Deduytsche, De Pinte (BE)

(73) Assignee: UNIVERSITEIT GENT, Ghent (BE)

( * ) Notice: Subject to any disclaimer, the term of this patent is extended or adjusted under 35 U.S.C. 154(b) by 60 days.

(21) Appl. No.: 14/767,782

(22) PCT Filed: Feb. 14, 2014

(86) PCT No.: PCT/EP2014/052956
§ 371 (c)(1),
(2) Date: Aug. 13, 2015

(87) PCT Pub. No.: WO2014/125091
PCT Pub. Date: Aug. 21, 2014

(65) Prior Publication Data
US 2016/0030909 A1 Feb. 4, 2016

(30) Foreign Application Priority Data
Feb. 14, 2013 (EP) .................................... 13155321

(51) Int. Cl.
*C23C 16/00* (2006.01)
*B01J 19/00* (2006.01)
(Continued)

(52) U.S. Cl.
CPC ......... *B01J 19/0046* (2013.01); *C23C 14/042* (2013.01); *C23C 14/3464* (2013.01);
(Continued)

(58) Field of Classification Search
CPC . H01J 2237/081; C23C 14/505; C23C 14/042
(Continued)

(56) References Cited

U.S. PATENT DOCUMENTS 4,814,056 A * 3/1989 Welty ................. C23C 14/044
118/720
5,225,057 A * 7/1993 LeFebvre ................ C23C 8/02
204/192.12
(Continued)

FOREIGN PATENT DOCUMENTS

EP 2469619 A1 6/2012
JP 2004035983 A 2/2004
WO 2006087558 A2 8/2006

OTHER PUBLICATIONS

Chevrier et al., "Production and Visualization of Quaternary Combinatorial Thin Films," Measurement Science and Technology, 2006, pp. 1399-1404, vol. 17.
(Continued)

*Primary Examiner* — Keath T Chen
(74) *Attorney, Agent, or Firm* — Workman Nydegger

(57) ABSTRACT

A system for combinatorial deposition of a thin layer on a substrate is described. The system comprises at least one deposition material source holder and a substrate holder. The system also comprises a rotatable positioning system for subsequently positioning the at least one substrate in parallel and in non-parallel configuration with at least one deposition material source. The system comprises at least one mask holder arranged for positioning a mask between at least one of the target holder and the positioning system, for allowing variation of the material flux across the at least one substrate when the combinatorial deposition is performed. The mask holder is in a fixed arrangement with respect to the at least one deposition material source holder during the combinatorial depositing.

14 Claims, 7 Drawing Sheets

(51) Int. Cl.
*C23C 14/04* (2006.01)
*C23C 14/34* (2006.01)
*C23C 14/50* (2006.01)
*H01J 37/32* (2006.01)
*H01J 37/34* (2006.01)

(52) U.S. Cl.
CPC ...... *C23C 14/505* (2013.01); *H01J 37/32715* (2013.01); *H01J 37/32752* (2013.01); *H01J 37/3435* (2013.01); *H01J 37/3447* (2013.01); *B01J 2219/0043* (2013.01); *B01J 2219/00689* (2013.01); *B01J 2219/00695* (2013.01); *H01J 2237/006* (2013.01); *H01J 2237/081* (2013.01); *H01J 2237/0825* (2013.01); *H01J 2237/2007* (2013.01); *H01J 2237/20214* (2013.01); *H01J 2237/2485* (2013.01); *H01J 2237/332* (2013.01)

(58) Field of Classification Search
USPC ........................................ 156/345.3; 118/721
See application file for complete search history.

(56) References Cited

U.S. PATENT DOCUMENTS

| | | | | |
|---|---|---|---|---|
| 5,328,582 A | * | 7/1994 | Cole | C23C 14/352 204/192.12 |
| 5,558,721 A | * | 9/1996 | Kohmura | C23C 16/4588 118/500 |
| 5,584,973 A | * | 12/1996 | Wada | C23C 14/34 204/192.12 |
| 5,693,179 A | * | 12/1997 | Blackburn | H01J 37/32449 204/192.32 |
| 6,454,908 B1 | * | 9/2002 | Schertler | H01L 21/68764 118/719 |
| 6,485,616 B1 | * | 11/2002 | Howard | C23C 14/505 118/728 |
| 7,767,627 B1 | | 8/2010 | Goldwasser et al. | |
| 2001/0007715 A1 | | 7/2001 | Toyoshima et al. | |
| 2006/0196423 A1 | * | 9/2006 | Huang | C23C 14/505 118/720 |
| 2009/0260975 A1 | | 10/2009 | Davis | |
| 2012/0045588 A1 | * | 2/2012 | DeVito | C23C 14/0042 427/475 |
| 2012/0080308 A1 | | 4/2012 | Kameyama | |
| 2014/0174912 A1 | * | 6/2014 | Waugh | H01J 37/32779 204/192.15 |

OTHER PUBLICATIONS

Dahn et al., "Economical Sputtering System to Produce Large-Size Composition-Spread Libraries Having Linear and Orthogonal Stoichiometry Variations," Chem. Mater., 2002, pp. 3519-3523, vol. 14.
Extended European Search Report for corresponding European Application No. 13155321.6, dated Jul. 4, 2013.
International Search Report for corresponding International PCT Application No. PCT/EP2014/052956, dated May 6, 2014.
Takahashi et al., "Computer Design of Combinatorial Shadow Mask for Ternary Composition Spread Library," Measurement Science and Technology, 2005, pp. 292-295, vol. 16.

* cited by examiner

DEPOSITION TOOL FOR COMBINATORIAL THIN FILM MATERIAL LIBRARIES

FIELD OF THE INVENTION

The invention relates to the field of thin film deposition. More specifically the present invention relates to methods and systems for combinatorial deposition of materials, e.g. for generating test samples, as well as to samples thus obtained.

BACKGROUND OF THE INVENTION

Alloys typically have properties that vary with the contribution of the different components in the alloy. Consequently, in order to obtain materials with particular properties or in order to study the variation of properties with varying contribution of different components, screening of the properties of alloys often is performed. Whereas such screening could be performed on a large number of separately prepared samples, it is preferred to prepare a sample where a controlled variation of the composition of alloy occurs over the surface. The latter is less time and labour intensive and allows to reduce the amount of preparation materials required.

Good preparation of binary, ternary, quaternary or higher order alloys with a controlled varying composition over the surface is difficult. A technique often applied is combinatorial sputtering. Most often ternary alloys are deposited using 2, 3 or more targets. Targets thereby consist either out of a pure element or out of different elements mixed up in one target.

In one manufacturing technique for making combinatorial sputtered samples, the substrate is positioned above the targets positioned in a vacuum system, the targets all being directed towards the substrate. The flux of the different targets hit the substrate simultaneously and the variation of the distance between different positions on the substrate and the target results in different contributions of the sputtered element to the composition of the alloy deposited.

In another approach, multilayers are deposited on the substrate. The substrate is moved over the different sputter targets and for each target, a certain film thickness of the target material is deposited. In order to cover a lot of compositions in the binary, ternary or higher order phase diagram, depositions are performed using complicated masks and automated shutters, to induce the proper variation of the contribution of the different elements. Furthermore, With this approach only a discrete amount of compositions can be made and since it is an intrinsic multilayer system, deposition is slow since samples and/or shutters have to move and the samples needs to be further annealed to homogenize the sample which can cause changes in the sample.

In Chem. Mater. 2002, 14, 3519-3523, Dahn describes a multi-target sputtering machine to produce films on wafers that map large portions of ternary phase diagrams whereby the elements sputtered on the wafer vary with the position. A substrate is moved in a horizontal plane above different targets. The targets are positioned on a horizontal plate, parallel to the horizontal plane wherein the different substrates move. In between the target and the sample special designed masks are placed to have a gradient of the specific material on the sample. A "linear" mask opening and a "constant" mask opening is demonstrated. The method is demonstrated for a $SiSn_xAl_y$ (0<x, y<1) film on a substrate of 75×75 mm. In one direction an increasing Sn content is demonstrated and in a direction perpendicular to that direction an increasing concentration of Al is demonstrated. When the sample is positioned above a first target A a thin gradient of material A is deposited. When the sample moves from target A to target B, the sample makes a rotation over 120° around its own axis to have a gradient in a different direction. Then a gradient of material B is deposited. Moving towards a third target C, the sample again rotates around its own axis over 120°, and at target C, a thin gradient layer of material C is deposited. When the samples moves back towards target A, the sample is rotating once more in order to be in the original position when passing target A.

In Meas. Sci. Technol. 17 (2006) 1399, Dahn describes, using a similar setup, a method for the production of four-component combinatorial thin films. The system requires design of complex shadow masks and upscaling to obtain a higher resolution in composition or to use more targets is limited by the vacuum system size.

SUMMARY OF THE INVENTION

It is an object of embodiments of the present invention to provide a system and method for deposition of combinatorial samples.

It is an advantage of embodiments according to the present invention that a deposition tool and technique for depositing samples with a controlled varying composition is provided, whereby in a single deposition run, nearly all compositions of a binary or ternary alloy can be provided.

It is an advantage of embodiments of the present invention that a deposition tool and technique for depositing samples with a controlled varying composition of a quaternary or higher order alloy system is provided, whereby the contribution of one or more components is fixed but whereby the contribution of two or three components can vary over nearly the full range. This results in the deposition of a thin film combinatorial material library which represents a cross-sectional slice of the higher order, multi-dimensional phase diagram. With higher order alloys, there may be meant ternary alloys or alloys comprising more than 3 different elements.

It is an advantage of embodiments according to the present invention that composition variation of the deposited alloys can change in a continuous way. Alternatively, also a trapped profile of material layers can be deposited, whereby in a given area or zone, a particular thickness and/or composition is obtained.

It is an advantage of embodiments of the present invention that a system and technique is provided that allows high scalability. For example, the technique allows easy scalability to substrates with a diameter up to 150 mm, even in conventional deposition systems such as sputtering systems.

It is an advantage of embodiments of the present invention that the number of targets can be easily increased. In some embodiments, the number of deposition source materials, e.g. targets, can for example be up to 6 different deposition source materials, e.g. targets.

It is an advantage of embodiments of the present invention that the number of mask holders can be easily increased. It is an advantage of embodiments of the present invention that the system comprises for each of the deposition material source holders a corresponding mask holder, each of the mask holders being arranged for holding a separate mask. Embodiments of the present invention comprising multiple mask holders may reduce the need to interchange the masks during the combinatorial sputtering process.

It is an advantage of embodiments of the present invention that more than one sample can be made simultaneously. In some embodiments, for example up to 8 different substrates can be used for simultaneously making 8 samples. These 8 samples can all be identical, or they can represent 8 different slices through e.g. a quaternary phase diagram that are generated in a single deposition run.

It is an advantage of embodiments of the present invention that a very homogeneous thickness of the deposited materials over the deposited sample area can be obtained, even for combinations of 2, 3, 4 or even more materials.

It is an advantage of embodiments of the present invention that ternary composition gradients can be induced in a continuous manner over the full compositional range of a ternary alloy. It is an advantage of embodiments of the present invention that combinatorial samples can be made having a varying composition within a selected portion of interest in the ternary phase diagram. The latter allows to restrict the composition variation to a portion of interest, thus rendering the useful area of the sample obtained large or optimal. Furthermore, such zooming in the ternary phase diagram to a portion of interest allows increasing the composition resolution, thus increasing the available area size for measuring a property of an alloy with a selected composition. It thus is an advantage of embodiments of the present invention that a controllable concentration distribution with high composition resolution can be obtained.

It is an advantage of embodiments that the large scale on which the sample can be deposited and, as a result thereof, the large compositional resolution, allows to select well defined compositions on the sample for characterizing properties. The area that can be used for studying a certain composition, i.e. the area wherein the composition variation is sufficiently small to neglect it, can be large when embodiments of the present invention are used.

It is an advantage of embodiments of the present invention that higher order alloys, e.g. quaternary or even higher phase alloys, can be produced by adding additional deposition source materials, e.g. targets, and depositing them e.g. evenly over the substrate. It thereby is an advantage of embodiments of the present invention that different samples with different composition of a fourth, fifth or further component in the alloy can be made during the same deposition run, i.e. substantially simultaneously with the preparation of the other samples.

It is an advantage of embodiments of the present invention that mask design can be performed in an easy manner and that good, e.g. linear or stepwise, variation of at least some components, in the alloy phase diagram can be obtained, without the need for too complex masks, even for different sizes or types of deposition source materials, e.g. sputtering targets. The latter results in easier manufacturability of the masks.

It is an advantage of embodiments of the present invention that automated techniques may be provided for designing, e.g. parameterizing, masks for use in the combinatorial deposition technique. It is an advantage that software simulation techniques can be used for this. It is an advantage of embodiments of the present invention that relatively simple masks can be designed and used for e.g. obtaining a constant thickness profile, for zooming into a composition range, etc.

It is an advantage of embodiments of the present invention that the mask design may take input of an experimentally measured deposition profile from a target, thus allowing further optimization of the mask(s) used.

It is an advantage of embodiments of the present invention that it can be based on sequential deposition of ultrathin graded layers in such a way that deposited materials can be completely intermixed. Alternatively, a set of multilayers can be generated. Distinguishing between intermixed layers and multilayers can be performed based on x-ray diffraction, whereby multilayers provide separate diffraction peaks of the composite component materials in the XRD spectrum, whereas intermixed layers either do not induce diffraction peaks in the XRD spectrum when they are amorphous, or exhibit shifted diffraction peaks in the case of a solid solution.

It is an advantage of embodiments of the present invention that the technique can be applied both in DC and in RF sputtering mode. It is an advantage of embodiments of the present invention that reactive deposition also can be applied.

It is an advantage of embodiments of the present invention that combinatorial samples can be obtained with a high thickness uniformity over the sample, while providing a good composition variation over the sample.

It is an advantage of embodiments according to the present invention that the system can be embedded in conventional barrel type deposition systems, allowing easy integration into existing vacuum chambers and deposition systems.

The above objective is accomplished by a method and device according to the present invention.

The present invention relates to a system for combinatorial depositing of a thin film having a varying composition and/or varying thickness on at least one substrate, the system comprising at least one deposition material source holder, e.g. a target holder, arranged so as to carry a deposition material source, e.g. a target, a substrate holder adapted for carrying at least one substrate, a rotatable positioning system having a rotation axis for relatively moving the substrate holder and the at least one deposition material source holder with respect to each other for subsequently positioning the at least one substrate in a parallel configuration in front of at least one of the at least one deposition material source and in a non-parallel configuration non-parallel with the at least one of the at least one deposition material source during the combinatorial depositing, and at least one mask holder arranged for positioning a mask between at least one of the at least one deposition material source holder and the substrate holder, for allowing variation of the material flux across the at least one substrate when the combinatorial depositing is performed, wherein the at least one mask holder is in a fixed arrangement with respect to the at least one deposition material source holder during the combinatorial depositing. Combinatorial depositing of a thin film on a substrate may be defined as depositing a thin film of a single element or a combination of elements varying in thickness over the substrate, i.e. a thin film of a single element or a combination of elements having a varying thickness and/or as depositing a thin film of different elements, e.g. alloys, and whereby a variation, e.g. variation in the composition of the alloy is present. Positioning the at least one substrate in a parallel configuration in front of a deposition material source may be defined as positioning a deposition surface of the substrate, i.e. the surface of the substrate onto which material needs to be deposited, parallel to a target surface of the deposition material source. Positioning the at least one substrate in a non-parallel configuration in front of a deposition material source may be defined as positioning the deposition surface of the substrate non-parallel to the target surface of the deposition material source. The system may be a system for combinatorial sputtering of a thin film. The system may be a system for combinatorial sputtering of a thin film having a varying composition and/or a varying thickness. The deposition material source holder may be a sputter target holder and the depositing may be sputtering.

The rotatable positioning system thus may be adapted for rotating the at least one substrate when positioned in the substrate holder so as to switch between the parallel and non-parallel configuration. The rotatable positioning system may be adapted for rotating the at least one deposition material, e.g. sputter target, when positioned in the deposition material source holder together with the corresponding at least one mask holder which is in a fixed arrangement with respect to the deposition material source holder so as to switch between the parallel configuration and the non-parallel configuration. An axis orthogonal to a plane of the substrate or the material deposition source may be substantially perpendicular to the rotation axis of the rotatable positioning system. The rotating positioning system may be called a rotating drum.

The system may be adapted for depositing at least one of binary, ternary, quaternary or higher order alloys, wherein the system may comprise two deposition material source holders arranged so as to position different deposition material sources in different planes and wherein the positioning system is adapted for relatively rotating the substrate holder and the at least two deposition material source holders with respect to each other for subsequently positioning the at least one substrate in front of the different deposition material sources.

The at least one substrate holder may be positioned on the rotatable positioning system and the at least one deposition material source holder, e.g. the at least two deposition material source holders, may be surrounding or enclosing the positioning system.

The positioning system may comprise a controller programmed for temporarily subsequently placing the substrate holder in front of each of the at least two deposition material source holders. This may be achieved for instance by a rotatable positioning system having a rotation axis perpendicular to the substrate surface of the substrate positioned in the substrate holder and the target surface of the material source of the material source holder.

Where reference is made to "in front", reference is made to an arrangement wherein the substrate is positioned with respect to the deposition material source so that upon deposition action, the material can be deposited on the substrate.

In case there are at least two deposition material sources, the at least one mask holder may be adapted for simultaneously positioning masks in front of each of the at least two deposition material source holders.

The at least one mask holder may comprise at least a first and a second mask holder arranged for simultaneously positioning a first and a second mask between the substrate holder and respectively at least a first and a second deposition material source holder, the first and the second mask holder being in a fixed arrangement with respect to respectively the first and the second deposition material source holder during the combinatorial depositing.

The positioning system may comprise a cylindrical shaped base portion.

The substrate holder may be rotatable for rotating a substrate around a substrate rotation axis orthogonal to the plane of the substrate when it is positioned in the substrate holder.

The substrate rotation axis may be orthogonal to the rotation axis of the rotatable positioning system.

The substrate holder may comprise a substrate rotation means for rotating the substrate around a substrate rotation axis. The system may further comprise movement transfer means for inducing a rotation around the substrate rotation axis upon rotation of the positioning system around the rotation axis of the rotatable positioning system.

The substrate rotation means may be adapted for inducing a different rotation angle for the substrate around the substrate rotation axis for each position of the rotatable positioning system wherein the substrate is positioned in front of one of the at least two target holders.

The at least one mask holder may comprise a mask for allowing variation of the material flux across the at least one substrate when the combinatorial sputtering is performed.

The mask may comprise a triangular shaped mask opening.

The system may comprise at least three deposition materials source holders and may be adapted for depositing ternary alloys. Alternatively, one or more deposition materials sources may comprise multiple elements and two or more elements may be deposited from the same deposition materials source. The system may comprise at least four deposition material source holders and may be adapted for depositing quaternary alloys. Alternatively, one or more deposition materials sources may comprise multiple elements and two or more elements may be deposited from the same deposition material source.

The system may comprise a Venetian blind shaped mask as mask in front of one of the at least four deposition materials source holders, whereby a contribution of a deposition materials source material of the deposition materials source positioned in said one deposition materials source holder can be controlled by the degree wherein the Venetian blind shaped mask is opened.

The substrate holder may be adapted for positioning at least three substrates simultaneously, each of the substrates being in a different plane.

The present invention also relates to a method for depositing a thin film on at least one substrate, the method comprising subsequently relatively positioning the at least one substrate in parallel with and non-parallel with at least one deposition material source,
and depositing material through a mask positioned between the deposition material source and the substrate whereby the mask is adapted for inducing a variation of the material flux of the material across the at least one substrate.

The subsequently relatively positioning may comprise subsequently relatively positioning the at least one substrate in a position in front of a plurality of different material deposition sources, the material deposition sources being positioned in different planes in space, and
for each of the relative positions of the at least one substrate with respect to the deposition material sources, depositing different deposition materials to the at least one substrate.

Subsequently relatively positioning the at least one substrate in a position in front of a plurality of different deposition material sources, e.g. sputter targets, may be performed a plurality of times dependent on the required thickness of the required alloy.

Subsequently relatively positioning the at least one substrate may comprise rotating the at least one substrate on a rotatable substrate holder having a rotation axis substantially parallel to the substrate.

The method may comprise, during said subsequently positioning, rotating the substrate around an axis perpendicular to the plane of the substrate for altering an orientation of the substrate with respect to a direction of variation of the material flux on the substrate.

The method may comprise depositing from three different deposition material sources, e.g. sputter targets, for preparing a ternary alloy and wherein said rotating the substrate around an axis perpendicular to the plane of the substrate comprises rotating in between said sputtering the substrate each time over an angle of 120°.

The method furthermore may comprise controlling a controllable mask for controlling the material flux on the substrate. It is an advantage of embodiments of the present invention that for quaternary or higher alloys, samples with varying contributions of three components and with a different but fixed contribution of a fourth component can be obtained, thus effectively producing a combinatorial library which represents a one- or two-dimensional slice through a multi-dimensional phase space. It is an advantage of embodiments of the present invention that several of these libraries with a varying amount of the fourth component can be made in one and the same deposition session (i.e. without the need for breaking the vacuum). The latter is not only relevant from cost, time and material efficiency point of view, but it is also results in an improved possibility for comparing different samples, as the deposition of the first three components is done under substantially the same conditions (i.e. during the same deposition session).

The method may be performed using a system as described above.

The deposition of each component may be performed sufficiently short for generating a binary, ternary, quaternary or higher order alloy without post processing.

The present invention also relates to a device comprising a thin film on a substrate with a varying composition or varying thickness over the surface area of the thin film, the thin film being made using a method as describe above. The thin film may be a binary, ternary, quaternary or higher order alloy thin film and wherein the thin film has a thickness variation over its surface smaller than 20%, advantageously smaller than 10%.

The present invention also relates to a method for designing a mask for use in a system as described above, the method comprising obtaining information regarding the materials to be deposited, at least one initial mask and the at least one substrate, simulating a deposition process as described above using the obtained information and determining properties of the simulated thin film, and adjusting a mask design of the at least one initial mask.

Such a method may be implemented as a computer program product.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
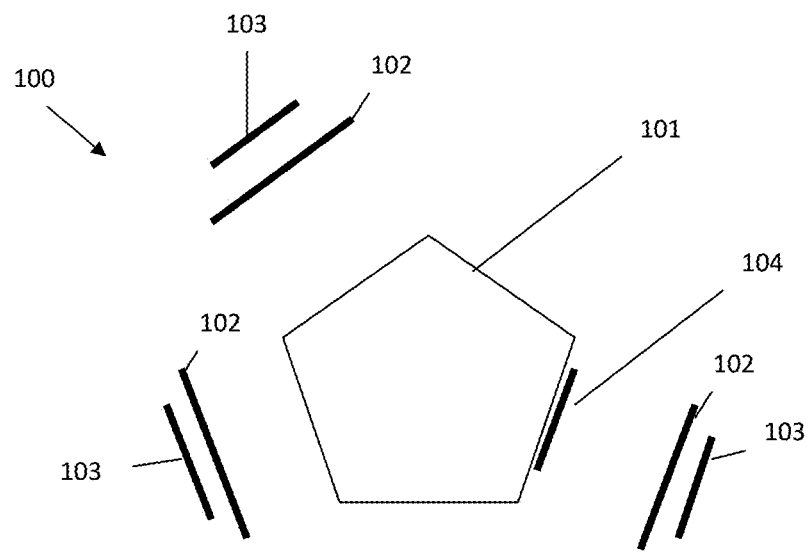
FIG. 1 shows a schematic drawing of the deposition system with deposition material source holders in different planes, according to an embodiment of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to a target and target material, more generally this applies to deposition material sources and materials thereof, the invention thus not being limited to sputter targets but more generally being applicable to deposition materials.

Where in embodiments of the present invention reference is made to "the plane of the target" reference is made to the part of the target, in literature also called "the face of the target", from which side the atoms are being deposited onto the substrate.

Where in embodiments of the present invention reference is made to material flux, reference may e.g. be made to "sputter deposition rate".

Where in embodiments of the present invention reference is made to a "substrate holder" reference is made to a mechanical holder in which a substrate can be mounted.

Where in embodiments of the present invention reference is made to the "positioning system" reference is made to a system carrying the substrate holders or the target holder(s). With "rotatable positioning system" reference is made to a positioning system carrying the substrate holder(s) or target holders whereby the positioning system itself is rotatable around its axis. The rotatable positioning system can be "a rotating drum".

Where in embodiments of the present invention reference is made to "the substrate rotation axis" reference is made to an axis around which the eventually mounted substrates are rotatable. The substrate rotating mechanism thereby typically is supported by the substrate holder. The substrate rotation axis can be defined relative to the positioning system. According to embodiments of the present invention the substrate rotation axis allows rotation of the substrate within the plane defined by the substrate.

Where in embodiments of the present invention reference is made to a component, reference is made to a single element or a combination of elements. The latter can e.g. be obtained by using a target material being a mixture of elements, e.g. an alloy. Where in embodiments of the present invention reference is made to a composition reference is made to the average composition of the alloy at that position or to the average composition of the laminated structure at that position.

Whereas the present invention will be described based on examples referring to sputter deposition and sputter targets, it will be clear for the skilled person that the method is equally applicable to other deposition techniques and that mutates mutandis reference can be made to material deposition and deposition material sources. For example, alternative techniques to sputtering may be pulsed laser deposition. Also a mixed mode of deposition techniques could be used. In some embodiments, appropriate orientation of the system may allow to use deposition techniques based on a molten material, e.g. the deposition system can be oriented such that a deposition source with molten material is positioned so that the material cannot spill out of the crucible when it is in molten condition.

Where in embodiments of the present invention reference is made to different deposition material source holders, reference is made to different deposition material source holders each comprising a deposition material source. It will be clear to the person skilled in the art that different deposition material source holders can share components and/or can comprise a single base portion.

Where in embodiments of the present invention reference is made to different mask holders, reference is made to mask holders each comprising a mask.

In a first aspect, a system and method is described to create samples comprising a thin film with a gradient composition or gradient thickness. In at least some advantageous embodiments, the thin film is an alloy comprising different elements and whereby a variation, e.g. gradient in the composition of the alloy is present. The method is based on depositing one or more deposition materials, e.g. sputtering of one or more target materials. Advantageously depositing of different deposition materials for making alloys may be performed, e.g. sputtering of different target materials for making alloys may be performed. The resulting samples are especially suitable for research purposes to study material properties as function of the alloy composition. Having a sample with composition variation over the sample, such a study is possible by measuring on different places over the sample. In its simplest format a binary alloy $A_xB_{1-x}$ ($0 \leq x \leq 1$) can be created whereby a variable composition over the surface of the sample is present. In one embodiment, the composition variation can be having 100% of material A on one side of the sample and 100% of material B on the other side of the sample and a variation, e.g. a continuous variation or a stepwise variation, in between. The method envisaged furthermore allows selecting a smaller portion of the composition phase diagram, so that e.g. variation of A and/or B can be limited to a smaller range than 0% to 100%. Advantageously, also higher order alloys such as for example, ternary, quaternary or still higher order alloys can also be created with a varying composition over the surface of the sample. Also for these higher order samples the variation of one or more elements may be limited to a range smaller than 0% to 100%. Alternatively, also samples with only a single component can be made, whereby e.g. a thickness gradient of the component occurs in the thin film. Therefore, although the system will be mainly described with reference to the manufacturing of binary or higher alloys, the system according to embodiments of the present invention also can be used for making samples having a single component varying in thickness over the substrate. Such thickness gradients can e.g. be used for systematic testing of the effect of layer thickness on diffusion for a particular material.

According to the first aspect, a system suitable for combinatorial depositing a thin film on a substrate, e.g. for depositing a binary, ternary, quaternary or higher order alloy, is disclosed. The system comprises at least one deposition material source holder arranged so as to carry a deposition material source. The system furthermore comprises a substrate holder adapted for carrying at least on substrate. The system also comprises a rotatable positioning system having a rotation axis for relatively moving the substrate holder and the at least one deposition material source holder with respect to each other for subsequently positioning the at least one substrate in a parallel configuration in front of at least one of the at least one deposition material source and in a non-parallel configuration non parallel with the at least one of the at least one deposition material source during the combinatorial deposition. According to embodiments of the present invention, the system also comprises at least one mask holder arranged for positioning a mask between at least one of the at least one deposition material source holder and the substrate holder, for allowing variation of the material flux across the at least one substrate when the combinatorial deposition is performed.

In some embodiments, the system may comprise at least two deposition material source holders, e.g. target holders, arranged so as to position different deposition material sources, e.g. sputter targets, in different planes. In such embodiments, the positioning system may be adapted for subsequently relatively positioning the at least one substrate in front of the different targets during the combinatorial deposition, e.g. sputtering.

It is an advantage of embodiments of the present invention that the deposition material sources, e.g. targets, are not positioned in the same plane, as for upscaling of the substrates, which implies the use of larger deposition material sources, e.g. targets, the available area in a single plane scales with the diameter of the vacuum system and therefore is significantly limited in view of economical and technical reasons. With the deposition material sources being mounted in different planes, the size limitations are less pronounced.

The system for combinatorial depositing of a thin film according to embodiments of the first aspect may refer to a combination of deposition material source holders, mask holders, sample holder(s) and a rotatable positioning system suitable for implementation in a deposition system, e.g. a vacuum sputtering system, or it may refer to a deposition system comprising such a combination of deposition material source holders, mask holders and a sample positioning system.

Whereas further embodiments will be described with reference to a system wherein the substrate holders are positioned on the positioning system and whereby the positioning system is a rotational system positioned in between the deposition material source holders, the skilled person will realize that also the inverse configuration can be applied, whereby the substrates are positioned in the peripheral region and the deposition material sources are positioned on a positioning means, e.g. rotatable positioning means.

Furthermore, while embodiments will be described with reference to sputter targets, embodiments are not limited thereby and envisage more broadly deposition material sources in general.

By way of illustration, embodiments of the present invention not being limited thereby, an exemplary system will be described with reference to FIG. 1 and following drawings. The system 100 essentially comprises a positioning system 101 for positioning one or more substrates in a substrate holder 104, at least one mask holder 102 and at least one target holders 103. The system also comprises a mask holder for positioning at least one mask between the positioning system 101.

The system for combinatorial sputtering 100 comprises at least one target holder for carrying a sputter target, in some embodiments at least two target holders 103 arranged so as to position different sputter targets in different planes. The target holder(s), for holding sputter targets, may be suitable for holding targets of any suitable size. In one example, the target may be a 5" by 10" rectangular target, in another example the target may be a circular target with a diameter of 3", although targets and thus holders for holding targets with a smaller or larger size also can be used. In the exemplary system described, the targets typically may be positioned in a vertical orientation, also referred to as upright, although embodiments of the present invention are not limited thereto. The at least two target holders 103 of the present example may be arranged in a target holder assembly or can be separate, individual target holders 103 not interconnected. The number of target holders 103 is not limited to 1, 2, 3 or 4 but may be higher, allowing e.g. sputtering of higher order alloys. The number of target holders 103 and thus the number of different materials that can be deposited may be determined based on the size of the sputter system wherein the components are positioned, the arrangement of the components in the system, and the application envisaged. In one system, e.g. up to 6 target holders can be provided. In some embodiments where there is more than one target holder, the target holders 103 typically all are positioned in a different plane, in other words, are arranged, e.g. positioned, such that targets mounted are positioned in different planes. In the exemplary system 100, the target holder assembly is a large barrel shaped element comprising a number of target holders 103, more particularly three target holders are shown. Alternatively, the target holders 103 can be arranged individually. The target holders can be arranged such that the targets are positioned vertically and that the target sputtering surfaces, when the targets are mounted, are directed towards an inside of the arrangement. In one embodiment, the arrangement of target holders and other components is implemented in a barrel coater, whereby the target holders 103 are positioned near the wall of the barrel coater and are arranged so that the sputter targets are facing the central axis of the barrel coater.

The target holders typically will be part of a sputtering unit, comprising the necessary components for invoking a sputtering action of the target when being in proper condition. The different components of sputter blocks are well known by the person skilled in the art and therefore are not described in detail here. They typically may comprise, amongst others, for example a magnet assembly, a DC, pulsed DC or RF power supply and electrical components for transferring the power to the target, a cooling means, etc.

The system furthermore comprises at least one substrate holder adapted for carrying at least one substrate. The at least one substrate holder 104, but advantageously more substrate holders 104 can be introduced so that multiple samples can be made simultaneously. The substrate holders may be made of any suitable materials and may work on any suitable principle, e.g. comprising a surface to glue the substrate on, comprising grooves for sliding or shifting the sample in, comprising clamps for clamping the sample, comprising a base portion and a holder portion for clamping the sample in between these elements, etc. The substrate holders may in one embodiment be adapted for mounting substrates, up to 150 mm in diameter, although also holders for larger or smaller substrates may be used.

The system furthermore comprises a rotatable positioning system 101 adapted for subsequently positioning the at least one substrate in parallel and non-parallel configuration with the at least one sputter target in the target holder 103. In some embodiments, the rotatable positioning system is adapted for subsequently positioning the at least one substrate in front of the different target holders 103, and thus if targets are mounted, in front of the targets during the combinatorial sputtering. In one embodiment, the positioning system 101 may be a rotating element such as a rotating drum 110, whereby upon rotation of the element the one or more substrate holders 104 and thus the one or more samples—when being mounted—are brought subsequently in front of different target holders 103. In the example shown, based on a barrel coater, the substrate holders are arranged such that the substrates are mounted in a vertical orientation.

The substrate holder(s) 104 also may be equipped with a heating means for heating the substrate to a particular temperature during deposition.

According to embodiments of the present invention, the positioning system 101 is such that the substrate holder(s) 104 and thus the substrate(s), when mounted, can be brought subsequently in front of the different target holders 103 and thus in front of the different targets. The positioning system 101 therefore is arranged rotatably and positioning the substrate holder(s) 104 in front of the target holders 103 is obtained by rotating the positioning system. Such a rotation typically may be around a rotation axis 112 of the positioning system. In the present example, the rotation 112 axis is positioned vertically, i.e. parallel with the orientation of the substrates and of the targets, when mounted in their respective holders. In the present example, the rotation of the positioning system may be a rotation around a vertical axis in the barrel coater. The movement, e.g. rotation, of the positioning system may be driven by a motor and the speed of movement may be selected as function of the application. The speed may be selected such that continuous movement can be used, whereby the sputter action is performed during movement. When the rotation is continuously going on, a film with a total thickness in the nm up to μm range can be deposited after several complete revolutions.

In some particular embodiments, the one or more substrate holder(s) on the positioning system also is mounted rotatable with respect to the positioning means, such that the substrate can be rotated around an axis perpendicular to the substrate. The system may comprise a movement transfer means such that movement, e.g. rotation of the positioning system around an axis of the positioning system induces movement of the substrate holder around a substrate rotation axis 114. The movement transfer means and/or the rotation system for rotating the substrate holder or part thereof may be adapted for inducing a different rotation angle for the substrate around the substrate rotation axis for each position of the positioning system wherein the substrate is positioned in front of one of the at least two target holders. A more detailed description of such a rotation means and/or movement transfer means is described further below.

The exemplary system furthermore comprises at least one mask holder 102 arranged for positioning a mask between at least one of the target holder and the positioning system. Such a mask holder allows positioning a mask which can induce variation of the material flux across the at least one substrate when the combinatorial sputtering is performed. Whereas in one embodiment the at least one mask holder 102 may be one mask holder so that a variation of the material flux across the at least one substrate is induced only for a single target material, advantageously a plurality of mask holders 102 is provided such that for each target holder 103 a mask holder 102 is present. The latter may allow to induce a material flux variation across the at least one substrate for more or all of the target materials that are subsequently sputtered on the substrate. The mask holders may be positioned in a fixed arrangement with respect to the target holders. The mask holders 102 may be combined in a sputter holder assembly, so that the mask holders can be handled during positioning by handling a single element. Alternatively, the mask holders 102 may for example be (all) separate elements. The mask holders may be adapted for holding the masks in any suitable way, e.g. by gluing, clamping, screwing, clicking, means for inserting, etc. In some embodiments, the masks also may be fixed to the mask holders. In other words, the mask holders may comprise the masks, so that the masks are part of the system. Masks inducing a particular variation of the material flux on the substrate can be used and designed, as will be illustrated further below.

The system according to embodiments of the present invention also may comprise a controller for controlling movement of the substrate with respect to the targets, such that the deposition time on the substrate during each of the subsequent passes of the substrate along a target can be controlled. Such a controller may be settable, programmable and may for example also operate according to predetermined settings or algorithms.

As indicated the system may be a sputter system or may be suitable for implementation in a sputter system. Such a sputter system typically comprises a vacuum chamber, in some embodiments having the shape of a barrel, cube, box, cylinder. The system furthermore typically may comprise a pumping system for inducing a vacuum, gas inlets, plasma generation means in as far as these are not already present in the sputtering units, additional cooling, optionally heating elements, shutter elements, powering elements, electrical circuitry, motor components for providing power for moving parts, actuation means for inducing movement of moving parts, etc.

The present invention also relates to a method for depositing a thin film, in some embodiments e.g. for sputtering different target elements, on a substrate, e.g. for combinatorial sputtering of binary, ternary, quaternary or higher order alloys. Alternatively, method embodiments may be used for depositing a thin film of a single material with varying thickness. The method according to embodiments of the present invention comprises subsequently relatively positioning the at least one substrate in parallel with and non-parallel with at least one deposition material source and depositing material through a mask positioned between the deposition material source and the substrate whereby the mask is adapted for inducing a variation of the material flux of the material across the at least one substrate. In particular embodiments, the method comprises subsequently relatively positioning the at least one substrate in a position in front of a plurality of deposition material sources in different planes in space and for each of the relative positions of the at least one substrate, depositing, e.g. sputtering, material to the at least one substrate. The latter can e.g. be obtained by continuously sputtering of the targets and moving the sample so that it subsequently is positioned for receiving the sputtered particle flow, or sputtering may be performed only during those moments that the target is substantially in front of the target. The method further is characterized in that for at least one position the depositing is performed through a mask positioned between the deposition material source and the substrate whereby the mask is adapted for inducing a variation of the material flux across the at least one substrate. The duration that a sample is positioned in reach of the sputtered particle stream may be controlled so that either an alloy of the different materials is formed on the substrate, i.e. by keeping the substrate relatively short in front of each material per step, or a stack of multiple layers is formed on the substrate, i.e. by keeping the substrate relatively long in front of each deposition material. The process steps as described above may be repeated until the required alloy film thickness is obtained. Subsequently positioning the substrate may comprise implementing a relative movement between the substrate and the deposition material sources.

Subsequently positioning the substrate may include rotating the substrate around an axis of the system, e.g. on a rotating drum. Such an axis of the system may be parallel to the sputter targets. The method may be suitable for use with a plurality of deposition material sources, e.g. sputter targets, e.g. 1, 2, 3, 4, 5, 6 or more targets. The method advantageously may be performed using a system as described in the first aspect, although embodiments are not limited thereto. Methods according to embodiments of the present invention thus may comprise steps expressing the functionality of device elements present in a system according to the first aspect.

According to one embodiment, the method also may comprise upon moving the substrate to another plane for bringing the substrate in front of another deposition material source, e.g. sputter target, rotating the substrate around an axis perpendicular to the plane of the substrate. According to one embodiment, the method also may comprise bringing the substrate in front of as much targets as there are elements required in the alloy. Alternatively, two or more elements also may be present in a same material and/or an element of the alloy also may be introduced by providing it in gaseous form, e.g. during sputtering of other elements.

The method furthermore may comprise controlling a controllable mask for controlling the material flux, e.g. selecting a predetermined material flux, on the substrate. The latter may e.g. allow to deposit on different substrates different predetermined amounts of an element of the alloy.

In another aspect, the present invention relates to a sample comprising a thin film having a varying composition and/or varying thickness over the substrate, e.g. thin film being a binary, ternary, quaternary or higher order alloy thin film with a varying composition over the surface area of the thin film. According to embodiments of the present invention, the thin film is made using a method according to an embodiment as described above. The deposited surface area may have an average diameter of up to 150 mm or beyond. According to at least some embodiments of the present invention the thickness variation over the surface may be smaller than 10%, advantageously even smaller than 5%. In view of the large deposition area, such substrates can be more easily used for studying material properties as function of alloy composition, as the available surface for characterization, wherein variation occurs, can be significantly larger than for smaller samples. In other embodiments a thin film with a single component may be used, whereby a variation of the thickness is obtained, allowing studying material properties as function of layer thickness. Further features and advantages may be as described with reference to the manufacturing system and/or technique.

In one aspect, the present invention also relates to a method for designing a mask for use in a system as described in the first aspect. The method for designing comprises obtaining information regarding the materials to be deposited, at least one initial mask and the at least one substrate. Such information may for example comprise a material flux, a material type, an initial mask design, which may e.g. be selected as a triangular opening, a substrate type, a substrate temperature, a distance between mask and deposition material, a distance between substrate and deposition material, an environmental temperature, a pressure condition in the system, the presence and type of plasma, etc. The method furthermore comprises simulating a depositing process such as a sputtering process as described in the second aspect and using the obtained information. Such a simulation typically may allow determining properties of the simulated thin film. Such properties are typically provided as output of the simulation. The simulation may be based on numerical modeling. The method for designing furthermore may comprise adjusting the mask design as function of the initial mask design based on the obtained numerical modeling results. Such adjustment may be based on predetermined design rules, trial and error, based on a neural network, etc. The method for designing may be implemented as a computer program product.

Figure 2:
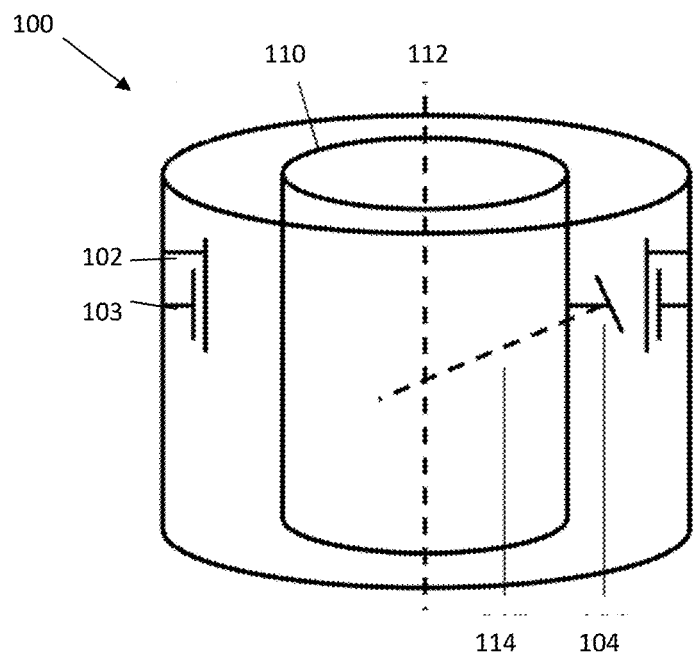
FIG. 2 shows a schematic drawing of the deposition system where the positioning system of the substrate holders can rotate, according to an embodiment of the present invention.
Figure 3:
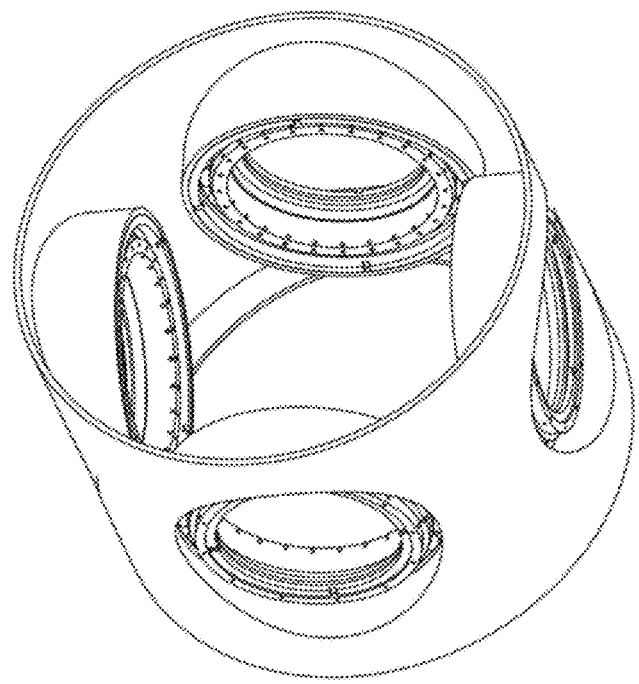
FIG. 3 illustrates the positioning system for the substrate holders with a rotating drum as positioning system, according to an embodiment of the present invention.
Figure 4:
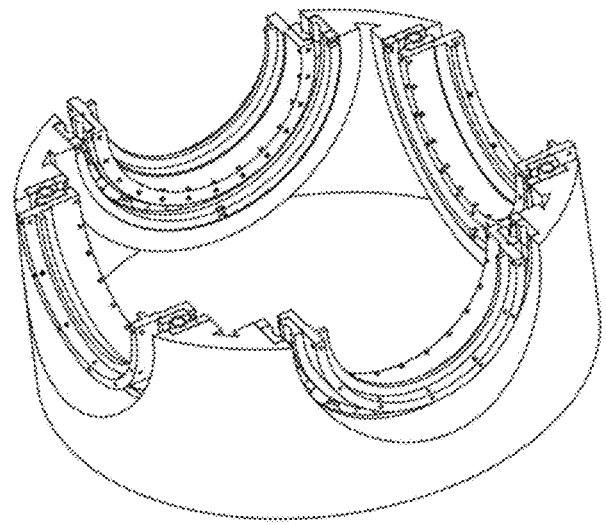
FIG. 4 shows a detailed view of how substrate holders can be mounted, according to an embodiment of the present invention.

By way of illustration, embodiments of the present invention not being limited thereto, a number of particular embodiments and experiments will be described below, illustrating features and advantages of at least some embodiments of the present invention. The examples will be described with reference to a barrel sputter system, although embodiments of the present invention are not limited thereto. An illustration of such a barrel deposition system as can be used in embodiments of the present invention is by way of illustration shown schematically in FIG. 2 and in full in FIG. 3 and FIG. 4, whereby the system is equipped for mounting 4 targets and 4 different substrates. In one particular design, a deposition system allowing mounting of up to 6 different targets, either rectangular 5×10" or round, up to 3" targets in a vertically orientation on a circular vacuum chamber with a diameter of 1 meter. Up to 8 substrates with a diameter up to 150 mm can be mounted on a rotating drum which fits in the vacuum chamber. In between the substrates and the targets, shadow masks are positioned. These shadow masks are stationary during deposition. During deposition, all the substrates are rotating around the central axis passing each round the different targets. Whereas depositions of the examples below can be easily performed using exemplary systems described above, embodiments of the present invention are not limited thereto.

Figure 5:
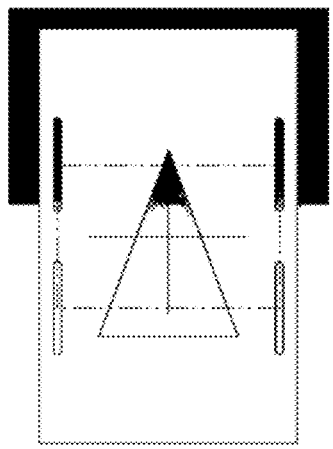
FIG. 5 illustrates an exemplary a triangular mask, as can be used in embodiments of the present invention.
Figure 6:
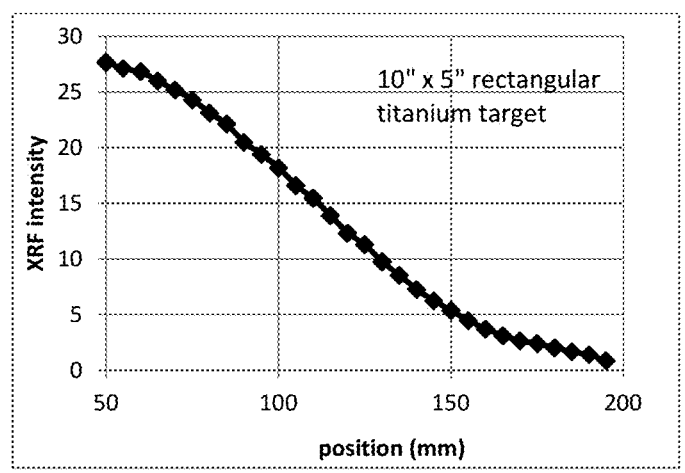
FIG. 6 shows the realized gradient after depositing through a triangular mask, according to an embodiment of the present invention.
Figure 7:
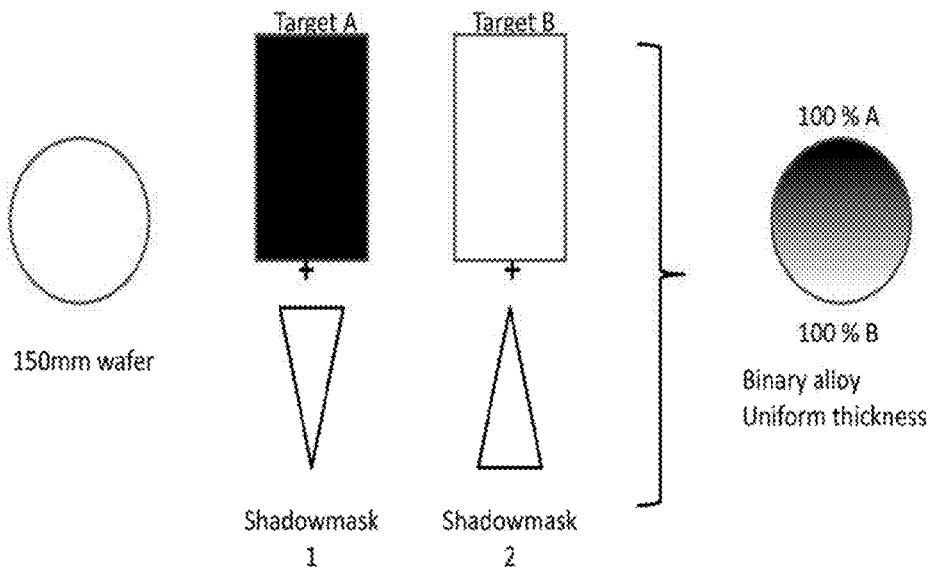
FIG. 7 shows a schematic overview of a mask and substrate positioning for creating a binary alloy, according to an embodiment of the present invention.

In a first example, an exemplary method for depositing a binary alloy is described based on a barrel shaped vacuum system wherein sputter targets are positioned near the outside wall and the substrate is mounted on a centrally positioned rotating drum. In order to obtain a binary alloy with a substantially linearly varying composition, use will be made of deposition of a linear gradient of materials, which can be obtained by putting a shadow mask, i.e. the mask as shown in FIG. 5, in between the rotating drum and the sputtering targets mounted on the walls (target holder) of the barrel coater. This shadow mask will limit the flux of the target through the triangular shaped hole in the metal plate. When a substrate is mounted on a rotating drum and the drum is rotating in the barrel coater during deposition, a linear gradient of a certain material can be deposited on a substrate, as illustrated in FIG. 6. Deposition of the binary alloy in the present example is reached according to the present example by positioning two identical shadow masks in front of two different targets. The two identical masks nevertheless are positioned differently, i.e. the mask in front of target A is positioned tip down and the triangular mask positioned in front of target B is positioned tip up, as shown in FIG. 7. Since the substrate(s) on the rotating drum are continuously rotating the substrate(s) will pass continuously target A, target B, target A, target B, . . . 2 linear gradients will be deposited though the maximum of each of the gradients is opposite. When the speed of the rotation is high enough the 2 gradients will be intermixed at the atomic level creating a binary alloy of material A and material B. When a low rotation speed of the rotation drum is chosen the resulting film will rather be a multilayer of element A, B, A, B, . . . .

Figure 8:
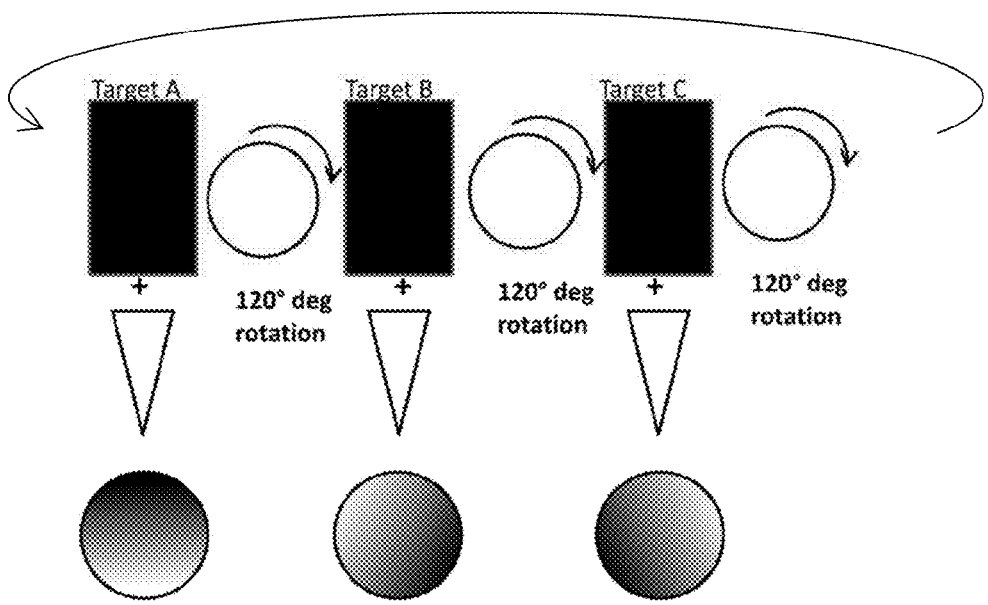
FIG. 8 illustrates a schematic overview of mask and substrate positioning for creating a ternary alloy, according to an embodiment of the present invention.

In a further example, the deposition of a ternary alloy is described. For the deposition of a ternary diagram, $A_xB_yC_z$, ($0 \leq x,y,z \leq 1$ with $x+y+z=1$) three triangular shadow masks (all tip up or all tip down) are positioned in between the rotating drum and 3 different targets. To create a ternary phase diagram, a linear gradient of 3 materials should be deposited in three directions. Therefore, the substrate is rotated over 120° when passing from one target to the other to cover all compositions of the ternary phase diagram for materials A,B,C, schematically shown in FIG. 8.

To establish the rotation of the substrates, in the present example, the rotation system for rotating the substrate in the substrate plane as function of its position in the system may for example be as follows. In the system, the substrates are put on a substrate holder which is mounted vertically and has the possibility to rotate around its own axis, e.g. by means of a ball bearing. On the back of the substrate holder 104 a fixed rod 120 can be mounted. In the center of the barrel coater a fixed plate 130 can be mounted. This plate 130 is fixed with respect to the barrel coater. On the fixed plate 130, extensions 135 can be foreseen at specific positions. During rotation of the rotating drum 110, the rods 120 mounted on the plate which is mounted on the substrate holder will hit the extensions 135 of the fixed plate 130. Since the rotating drum is forced to continue rotating and since the substrate holders are mounted in ball bearing 140 the substrate holder 104 and as a consequence the substrate will rotate over a certain angle around its own axis. The angle of rotation of the substrate can be regulated by shape of the extension on the fixed plate, by the amount of rods on the plate on the substrate holder and by a stopping mechanism. The stopping mechanism can be regulated by a different rod on the plate on the substrate holder which is forced to move above or below a guidance ring. Only at the point where the substrate should rotate, indentions are made in the guidance ring in order to let the substrate undergo the rotation. The amount of extensions provided on the fixed plate will determine the amount of rotations over a certain angle the substrate and substrate holder will undergo. For the deposition of a ternary phase diagram, 3 extensions are needed and also 3 rods on each of the substrate plates. The rotation of the substrate should only be performed when the substrate is not exposed to any of the sputtering targets. As a consequence the rotation of the substrate needs to be fast i.e. after the substrate has been exposed to a certain target but before the substrate is exposed to the next sputtering target. When used for depositing three materials the substrate is forced to rotate each time around its axis over 120°.

So when the substrate passes the first target A, a linear gradient of material A is deposited. When the substrate is in between target A and target B the substrate is rotated over 120°. When passing target B again a linear gradient is deposited. In between targets B and C, the substrate is again rotated over 120° in the same direction using the same mechanical mechanism. Passing target C, a linear gradient of material C is deposited on the third corner of the ternary phase diagram onto the substrate. After passing target C the substrate is again rotated over 120° returning the substrate to its original orientation. When this process is repeated for several rotations, a ternary film with a certain thickness can be deposited. Using this method nearly all compositions of the ternary phase diagram of material A, B and C can be deposited.

Figure 9:
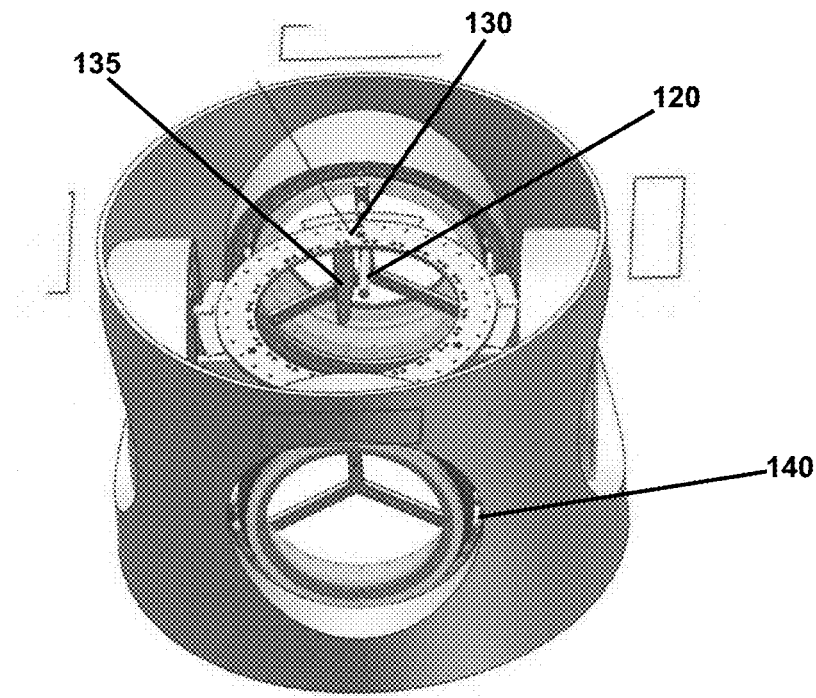
FIG. 9 illustrates a mechanism for controlling the substrate rotation (around its own axis) by rotating the drum, as can be used in an embodiment of the present invention.

By choosing the right sputtering power for the different targets a film with nearly all compositions of a ternary phase diagram with a uniform film thickness can be deposited. When 4 substrates are installed on the 4 different substrate holders, as illustrated in FIG. 9, all 4 substrates will have an identical composition. It needs to be noted that the speed of rotation of the rotating drum will influence the elemental composition profile in the deposited alloy. When the speed is low, multi-layers of elements A,B,C will be deposited, when the speed is high enough elements A, B and C will be intermixed on an atomic level creating an amorphous ternary compound.

By way of illustration, the situation for deposition of a quaternary alloy $A_iB_jC_kD_l$ ($0 \leq i,j,k,l \leq 1$ with $i+j+k+l=1$) also is described. While a ternary compositions is a 2 dimensional problem (a ternary phase diagram can be represented as a triangle), a quaternary or higher order alloys system is intrinsically a 3 dimensional problem. A quaternary phase diagram is represented as a pyramid. As a consequence all possible quaternary alloys cannot be printed at once on a 2 dimensional substrate. A systematic way to deposit quaternary alloys could be to deposit a ternary phase diagram as illustrated above and adding a constant thickness of a fourth element to the ternary phase diagram. In this way a slice in the quaternary phase diagram is created. Such a deposition can be obtained using an embodiment of the present invention.

The amount of slices of in the quaternary phase diagram that can be studied using samples simultaneously made with a deposition technique according to the present invention can maximally be the amount of possible substrates that can be mounted on the rotating drum. Therefore components of a quaternary alloy should be deposited: elements A, B and C using triangular shadow masks and a rotating drum can be deposited as described above while the fourth target material (D) can be deposited with a sputtering deposition rate controlled by a controllable mask. This mask could be a kind of a venetian blind which closes at the same speed of the rotation of the rotating drum, alternatively a mask with different transmission regions could be used, whereby the appropriate transmission region is selected for each substrate. Using the example of a venetian blind—like mask, for the first substrate passing target D, the venetian blind could be opened and the substrate could be exposed to the full flux of target D. When the second substrate passes target D, the venetian blind should be closed a little so the flux of target D is e.g. 90% for this substrate, for the third substrate the flux could be reduced to 80%, for the fourth substrate 70% flux of target D, . . . and so on for all of the substrates on the rotating drum. When the first substrate is passing target D again, the venetian blind should be fully opened again and when the second substrate passes target D, the venetian blinds should be again closed a little to reduce the flux for the second substrate to 90%, . . . in such a way that for every single rotation of the rotating drum all of the substrates are exposed to a different but fixed flux of target D. During the whole deposition the substrates thus are always exposed with the same flux, i.e. the first substrate is always exposed to the full flux of target D, the second substrate is each time exposed to a flux of 90% of target D, . . . . In this way, slices in the quaternary phase diagram can be deposited during one single deposition run.

It is to be noticed that also for higher dimensional phase systems, particular slices in the phase system can be obtained by mixing particular elements from a target. Such different elements can then be deposited from the same target. In the above case for example, component A could comprise different elements whereby a particular fixed ratio of the elements could be deposited. E.g. component A could be a SiGe target whereby a Si—Ge—B—C-D alloy is deposited.

Figure 10:
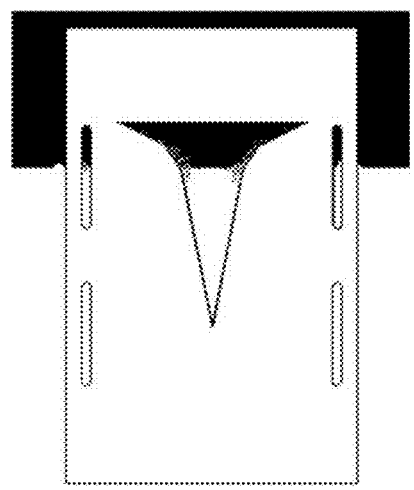
FIG. 10 shows a special designed mask to obtain a better linearity in the gradient, according to an embodiment of the present invention.
Figure 11:
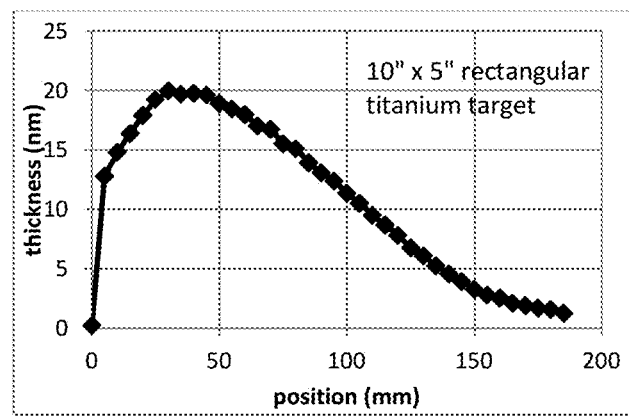
FIG. 11 shows a concentration distribution after sputtering through the mask shown in FIG. 10.

Further by way of illustration, it is described how small adaptations of the shadow masks can influence the deposition profile. For rectangular sputter targets, the linearity of the gradient can for example be improved by using a special designed triangular mask, some examples thereof being shown in FIG. 10 and FIG. 11. Such masks may be designed using a design method according to an embodiment of the present invention.

Figure 12:
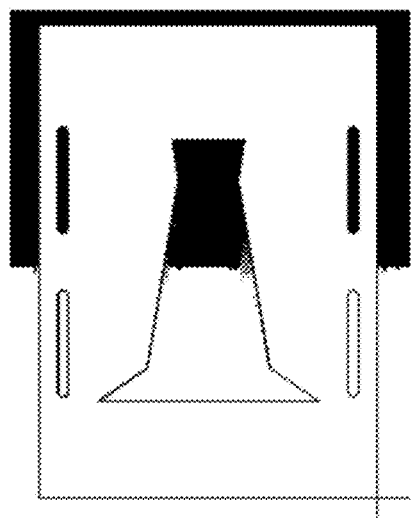
FIG. 12 shows a trapezoidal zoom mask, as can be used in embodiments of the present invention.
Figure 13:
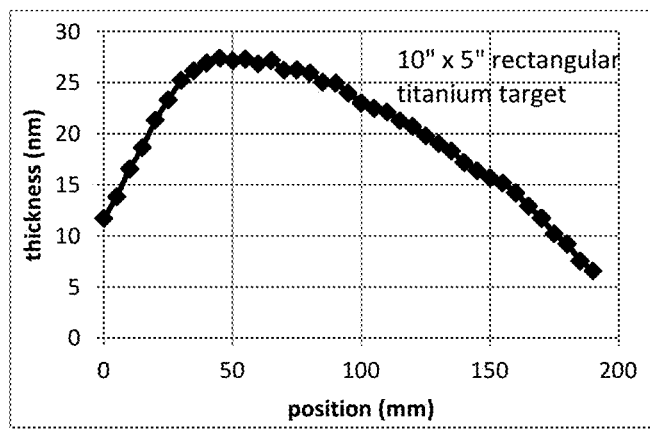
FIG. 13 shows a concentration distribution after sputtering through a trapezoidal zoom mask as shown in FIG. 12.
Figure 14:
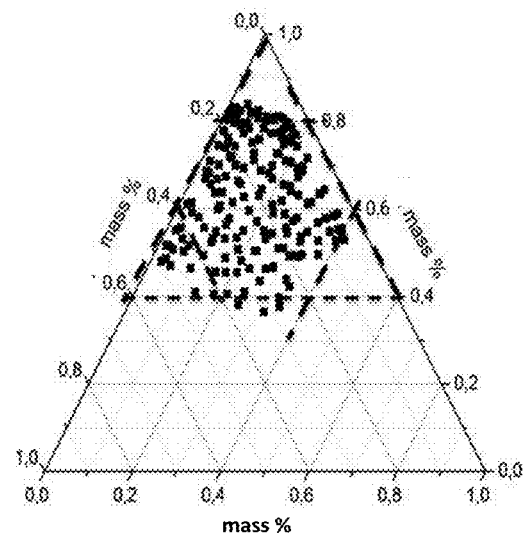
FIG. 14 illustrates zooming in into a specific region of a ternary phase diagram, as can be performed using an embodiment of the present invention.
Figure 15:
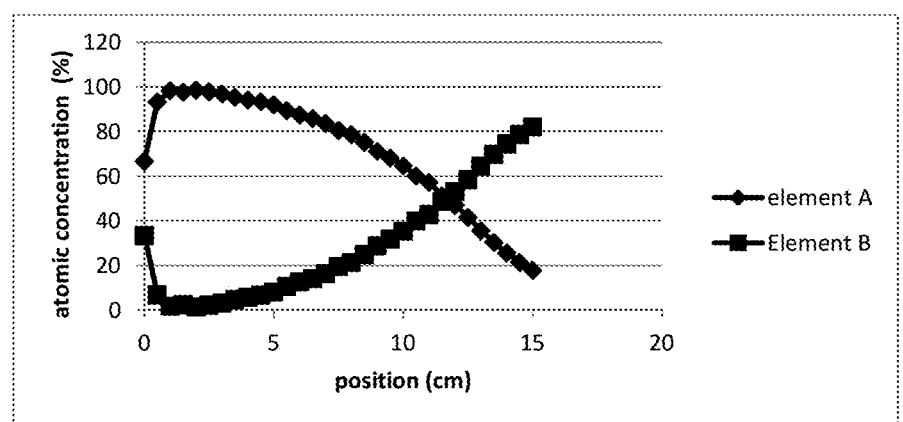
FIG. 15 shows the deposition of a binary alloy of elements A and B using two triangular shadow masks, according to an embodiment of the present invention.

A shadow mask as shown in FIG. 12 and FIG. 13 also produce a linear gradient but due to the trapezoidal shape the amount of material deposited varies in a range not going to 0%. Such masks can be used to zoom into a specific region of the ternary phase diagram, wherein one or more components is always present in the alloy. For example using a trapezoidal zoom mask for element A, and 2 triangular shaped masks for elements B and C one can deposited an alloy having a composition variation of only part of the ternary phase diagram. E.g. a ternary phase diagram with composition of element A between 40-80%, element B between 0-40% and element C between 0-40%. Using the shadow masks as described above and tuning the sputtering power the composition as described above can be deposited on a substrate as shown in the ternary diagram of FIG. 14. This graph represents the compositions of different data points which meets the above constraints.

The invention claimed is:

1. A system for combinatorial depositing of a thin film having a varying composition and/or a varying thickness on at least one substrate, the system comprising at least two deposition material source holders arranged so that the system comprises at least two deposition material sources, each of the at least two deposition material source holders being capable of holding one or more deposition material sources, a substrate holder adapted for carrying at least one substrate, a rotatable positioning system having a rotation axis for relatively moving the substrate holder and the one or more deposition material source holders with respect to each other for subsequently positioning the at least one substrate in a parallel configuration in front of at least one of the at least two deposition material sources and in a non-parallel configuration non parallel with the at least one of the at least two deposition material sources during the combinatorial deposition, and at least two mask holders each arranged for positioning a mask between the at least two deposition material sources positioned in the at least two deposition material source holders and the substrate holder, for allowing variation of the material flux across the at least one substrate when the combinatorial deposition is performed, and the at least two mask holders being in a fixed arrangement with respect to the deposition material sources in the at least two deposition material source holders during the combinatorial depositing, wherein the substrate holder furthermore is rotatable for rotating a substrate around a substrate rotation axis orthogonal to the plane of the substrate when it is positioned in the substrate holder, and wherein the substrate holder comprises a substrate rotation means arranged for rotating the substrate around a substrate rotation axis, the substrate rotation means including at least a ball bearing, whereby the system further comprises a movement transfer means for inducing a rotation around the substrate rotation axis upon rotation of the positioning system around the rotation axis of the rotatable positioning system, the movement transfer means including at least a rod extending from the substrate holder and a plate fixed on the positioning system, such that during rotation of the positioning system around the axis of the rotatable positioning system the plate is brought into contact with the rod, the contact between the plate and the rod causing the rotating of the substrate around the substrate rotation axis.

2. A system according to claim 1, wherein the system is a system for combinatorial sputtering of a thin film and wherein at least one of the at least two deposition material source holders is a sputter target holder arranged so as to carry a sputter target.

3. A system according to claim 1, the system being configured for depositing at least one of binary, ternary, quaternary or higher order alloys, wherein the system comprises two, three, four or more deposition material source holders arranged so as to each position a different deposition material source in different planes and wherein the positioning system is arranged for relatively rotating the substrate holder and two, three, four or more deposition material source holders with respect to each other for subsequently positioning the at least one substrate in front of the different deposition material sources.

4. A system according to claim 3, wherein the positioning system comprises a controller programmed for temporarily subsequently placing the substrate holder in front of each of the at least two deposition material source holders.

5. A system according to claim 3, wherein the at least two mask holders are each adapted for positioning at least one mask in front of each of the two, three, four or more deposition material source holders, such that at least one mask is present in front of each of the two, three, four or more deposition material source holders simultaneously.

6. A system according to claim 3, wherein the system comprises a first and a second mask holder and a first and a second deposition material source holder, the first and the second mask holder being configured for simultaneously positioning a first and a second mask between the substrate holder and respectively the first and the second deposition material source holder, the first and the second mask holder being in a fixed arrangement with respect to respectively the first and the second deposition material source holder during the combinatorial depositing.

7. A system according to claim 3, wherein the substrate rotation means is configured for inducing a different degree of rotation for the substrate around the substrate rotation axis for each position of the rotatable positioning system wherein the substrate is positioned in front of different deposition material source holders.

8. A system according to claim 1, wherein the substrate holder is positioned on the rotatable positioning system and wherein the at least two deposition material source holders surround the positioning system.

9. A system according to claim 1, wherein the rotatable positioning system comprises a cylindrical shaped base portion.

10. A system according to claim 1, wherein the substrate rotation axis is orthogonal to the rotation axis of the rotatable positioning system.

11. A system according to claim 1, wherein the system comprises at least three deposition material source holders and is configured for depositing ternary alloys.

12. A system according to claim 1, wherein the system comprises at least four deposition material source holders and is configured for depositing quaternary alloys and wherein the system comprises a Venetian blind shaped mask as mask in front of one of the at least four deposition materials source holders, whereby a contribution of a material of the deposition materials source positioned in said one deposition materials source holder can be controlled by the degree of rotation of the venetian blind wherein the Venetian blind shaped mask is opened.

13. A method for depositing a thin film having a varying composition and/or a varying thickness on at least one substrate using the system of claim 1, the method comprising subsequently relatively positioning the at least one substrate in parallel with and non-parallel with at least one deposition material source, and depositing material through a mask positioned between the deposition material source and the substrate whereby the mask is adapted for inducing a variation of the material flux of the material across the at least one substrate and whereby the mask is kept in a fixed arrangement with respect to the deposition material source during the depositing.

14. A method for depositing a thin film according to claim 13, wherein said subsequently relatively positioning comprises subsequently relatively positioning the at least one substrate in a position in front of a plurality of different material deposition sources, the material deposition sources being positioned in different planes in space, and for each of the relative positions of the at least one substrate with respect to the deposition material sources, depositing different deposition materials to the at least one substrate.

* * * * *